United States Patent
Inoue et al.

(10) Patent No.: US 7,372,089 B2
(45) Date of Patent: May 13, 2008

(54) SOLID-STATE IMAGE SENSING DEVICE

(75) Inventors: Tomoki Inoue, Kanagawa (JP); Shinji Uya, Miyagi (JP)

(73) Assignee: FUJIFILM Corporation, Tokyo (JP)

( * ) Notice: Subject to any disclaimer, the term of this patent is extended or adjusted under 35 U.S.C. 154(b) by 94 days.

(21) Appl. No.: 11/369,734

(22) Filed: Mar. 8, 2006

(65) Prior Publication Data

US 2006/0214199 A1 Sep. 28, 2006

(30) Foreign Application Priority Data

Mar. 9, 2005 (JP) .......................... P.2005-066038

(51) Int. Cl.
*H01L 31/062* (2006.01)

(52) U.S. Cl. ................ 257/292; 257/440; 257/E27.135

(58) Field of Classification Search ................ 257/292, 257/294, 435, 440, E27.134, E27.135
See application file for complete search history.

(56) References Cited

U.S. PATENT DOCUMENTS

| 5,619,049 | A | * | 4/1997 | Kim ........................... 257/223 |
| 5,739,851 | A | * | 4/1998 | Ohsawa et al. ............. 348/311 |
| 6,521,920 | B2 | * | 2/2003 | Abe ........................... 257/223 |
| 6,690,423 | B1 | * | 2/2004 | Nakamura et al. .......... 348/311 |
| 6,765,246 | B2 | * | 7/2004 | Inagaki ....................... 257/223 |
| 7,075,164 | B2 | * | 7/2006 | Uya ........................... 257/431 |

FOREIGN PATENT DOCUMENTS

JP 2002-83946 A 3/2002

* cited by examiner

*Primary Examiner*—T. N. Quach
(74) *Attorney, Agent, or Firm*—Sughrue Mion, PLLC (57) ABSTRACT

A solid-state image sensing device provided with photoelectric conversion films stacked above a semiconductor substrate, comprising: first impurity regions as defined herein; second impurity regions as defined herein; signal charge reading regions as defined herein; and third impurity regions as defined herein.

17 Claims, 9 Drawing Sheets

SOLID-STATE IMAGE SENSING DEVICE

FIELD OF THE INVENTION

The present invention relates to a solid-state image sensing device provided with photoelectric conversion films stacked above a semiconductor substrate.

BACKGROUND OF THE INVENTION

A CCD type or CMOS type solid-state image sensing device having a large number of photodiodes (PDs) integrated in a surface portion of a semiconductor substrate, and color filters of red (R), green (G) and blue (B) stacked on the PDs respectively has been improved remarkably in recent years. At present, a solid-state image sensing device having millions of PDs integrated into one chip is mounted in a digital camera.

In the solid-state image sensing device, there arise disadvantages in poor efficiency in utilization of light, occurrence of false color, etc. because the solid-state image sensing device is configured so that color filters are used. Therefore, a stack type solid-state image sensing device as described in JP-A-2002-83946 has been proposed as a solid-state image sensing device free from these disadvantages. This stack type solid-state image sensing device is configured so that three photoelectric conversion films for detecting red (R), green (G) and blue (B) light are stacked above a semiconductor substrate in such a manner that signal charges generated in the respective films are accumulated in storage diodes formed in the semiconductor substrate, and that the signal charges accumulated in the storage diodes are read by signal reading circuits such as vertical CCDs and horizontal CCDs formed in the surface of the semiconductor substrate so that the signal charges are transferred. According to the stack type solid-state image sensing device, a high-quality image can be generated while the aforementioned disadvantages are eliminated.

Figure 11:
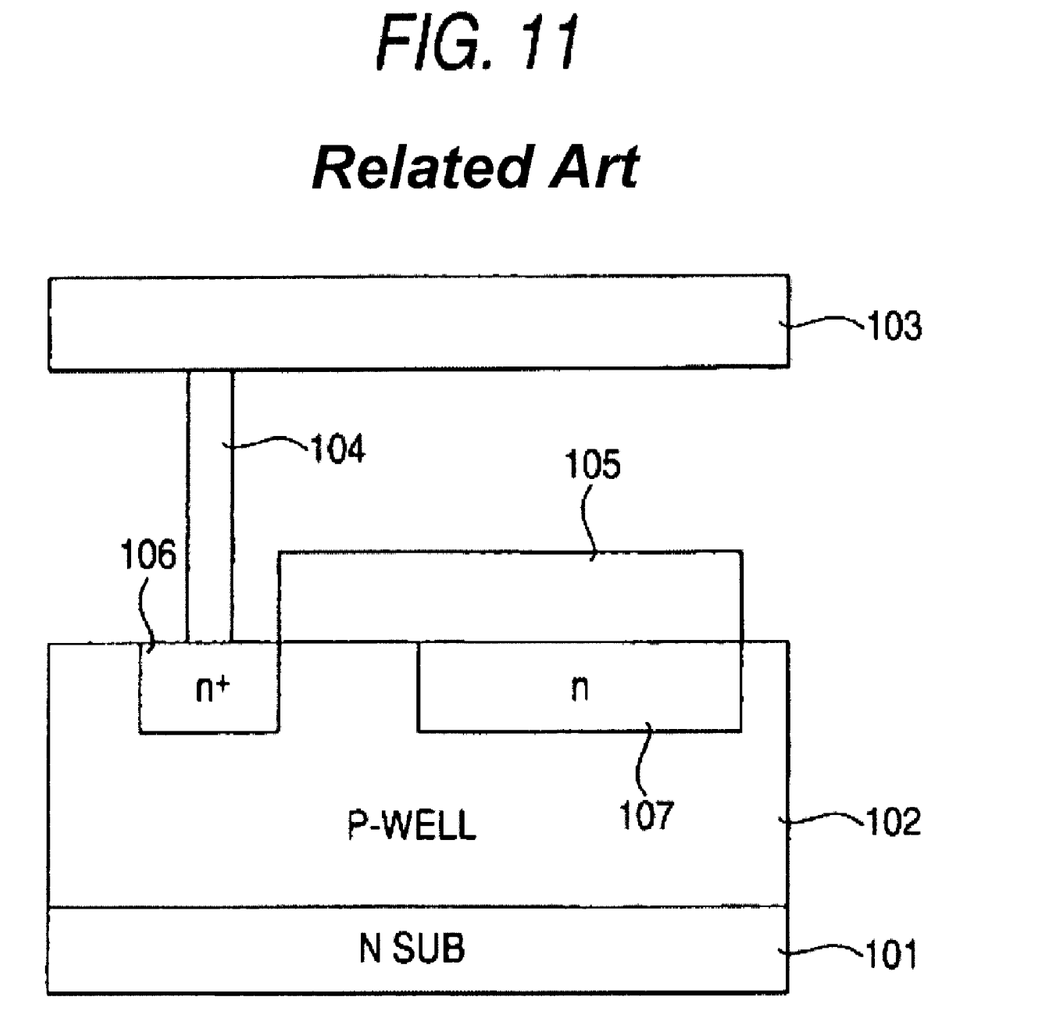
FIG. 11 is a partly sectional typical view of a stack type solid-state image sensing device according to the background art.

FIG. 11 is a partly sectional typical view of the stack type solid-state image sensing device according to the background art.

As shown in FIG. 11, a p-well layer 102 is provided in a surface portion of an n-type semiconductor substrate 101. An n+ region 106 and an n region 107 are formed in a surface of the p-well layer 102 so as to be slightly apart from each other. A photoelectric conversion film 103 stacked above the n-type semiconductor substrate 101 is electrically connected to the n+ region 106 by a wire 104. A transfer electrode 105 is provided on the n region 107 so that the transfer electrode 105 serves also as a reading electrode which reaches the n+ region 106. When a read pulse is applied to the transfer electrode 105, a signal charge reading region is formed between the n+ region 106 and the n region 107. Signal charge accumulated in the n+ region 106 is read to the n region 107. The signal charge accumulated in the n region 107 is then transferred.

Figure 12:
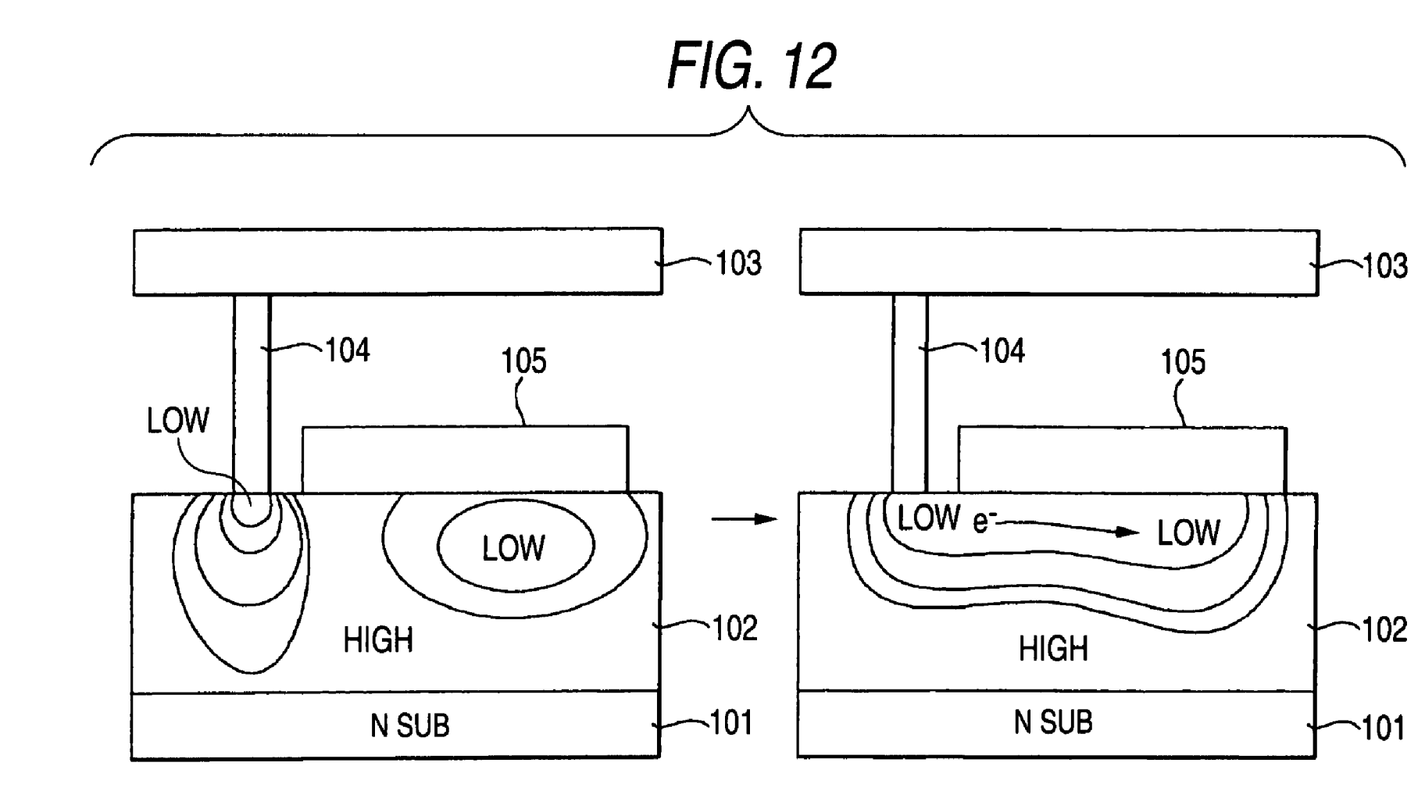
FIG. 12 is a view typically showing a potential transition state in the partial section of the stack type solid-state image sensing device depicted in FIG. 11.

FIG. 12 is a view typically showing a potential transition state in the partial section of the stack type solid-state image sensing device shown in FIG. 11. A left part of FIG. 12 shows a state in which a read pulse is not applied to the transfer-electrode 105. A right part of FIG. 12 shows a state in which a read pulse is applied to the transfer electrode 105. In FIG. 12, "Low" expresses a low potential portion, and "High" expresses a high potential portion. As the number of contour lines surrounding "Low" increases, the potential of the low potential portion decreases.

As shown in FIG. 12, when a read pulse is applied to the transfer electrode 105, signal charge e-accumulated in the n+ region 106 is poured into the n region 107 through the surface portion of the n-type semiconductor substrate 101 and accumulated in the n region 107.

SUMMARY OF THE INVENTION

In the structure as shown in FIG. 11, signal charge accumulated in the n+ region 106 is poured into the n region 107 through the surface of the n-type semiconductor substrate 101. In the surface of the n-type semiconductor substrate 101, dark current is however generated because of lattice defects. Accordingly, a large part of the dark current is included in the signal charge poured into the n region 107, so that image quality deteriorates.

Upon such circumstances, an object of the invention is to provide a stack type solid-state image sensing device in which the influence of dark current can be suppressed so that high-quality image sensing can be made.

The invention provides a solid-state image sensing device provided with photoelectric conversion films stacked above a semiconductor substrate, including: first impurity regions of a first conduction type electrically connected to the photoelectric conversion films and provided in a surface of the semiconductor substrate for accumulating signal charges generated in the photoelectric conversion films; second impurity regions of the first conduction type provided under the first impurity regions and lower in density than the first impurity regions for accumulating the signal charges accumulated in the first impurity regions; signal charge reading regions for reading the signal charges accumulated in the second impurity regions; and third impurity regions of a second conduction type provided in the surface of the semiconductor substrate and between the first impurity regions and the signal charge reading regions and reverse to the first conduction type.

According to this configuration, signal charges generated in the photoelectric conversion films are poured from the surface of the semiconductor substrate into the second impurity regions and read from the second impurity regions through the signal reading regions. Moreover, because the third impurity regions of the second conduction type are provided in the surface of the semiconductor substrate and between the first impurity regions and the signal charge reading regions, signal charges accumulated in the first impurity regions are not poured into the signal charge reading regions through the surface of the semiconductor substrate. As a result, the amount of signal charges flowing through the surface of the semiconductor substrate can be reduced when the signal charges are read, so that the influence of dark current on image quality can be suppressed.

In the solid-state image sensing device according to the invention, fourth impurity regions of the second conduction type are provided between the first impurity regions and the second impurity regions.

According to this configuration, the second impurity regions can be perfectly depleted, so that signal charges can be perfectly transferred from the second impurity regions to the signal charge reading regions.

In the solid-state image sensing device according to the invention, part of the second impurity regions dig into the signal charge reading regions.

According to this configuration, signal charges can be read easily.

In the solid-state image sensing device according to the invention, the third impurity regions are provided to surround the first impurity regions respectively.

According to this configuration, dark current can be suppressed more effectively.

According to the invention, there can be provided a stack type solid-state image sensing device in which the influence of dark current can be suppressed so that high-quality image sensing can be made.

DESCRIPTION OF REFERENCE NUMERALS

100: solid-state image sensing device
1: n-type semiconductor substrate
2: p-well layer
3 to 5: n+ region
6, 9: n region
7: device separation region
8: p region
11: transfer electrode
12: shading film
26: vertical wire
15: R photoelectric conversion film
19: G photoelectric conversion film
23: B photoelectric conversion film
20: vertical transfer portion
30: horizontal transfer portion
40: output portion

DETAILED DESCRIPTION OF THE INVENTION

Embodiments of the invention will be described below with reference to the drawings.

First Embodiment

Figure 1:
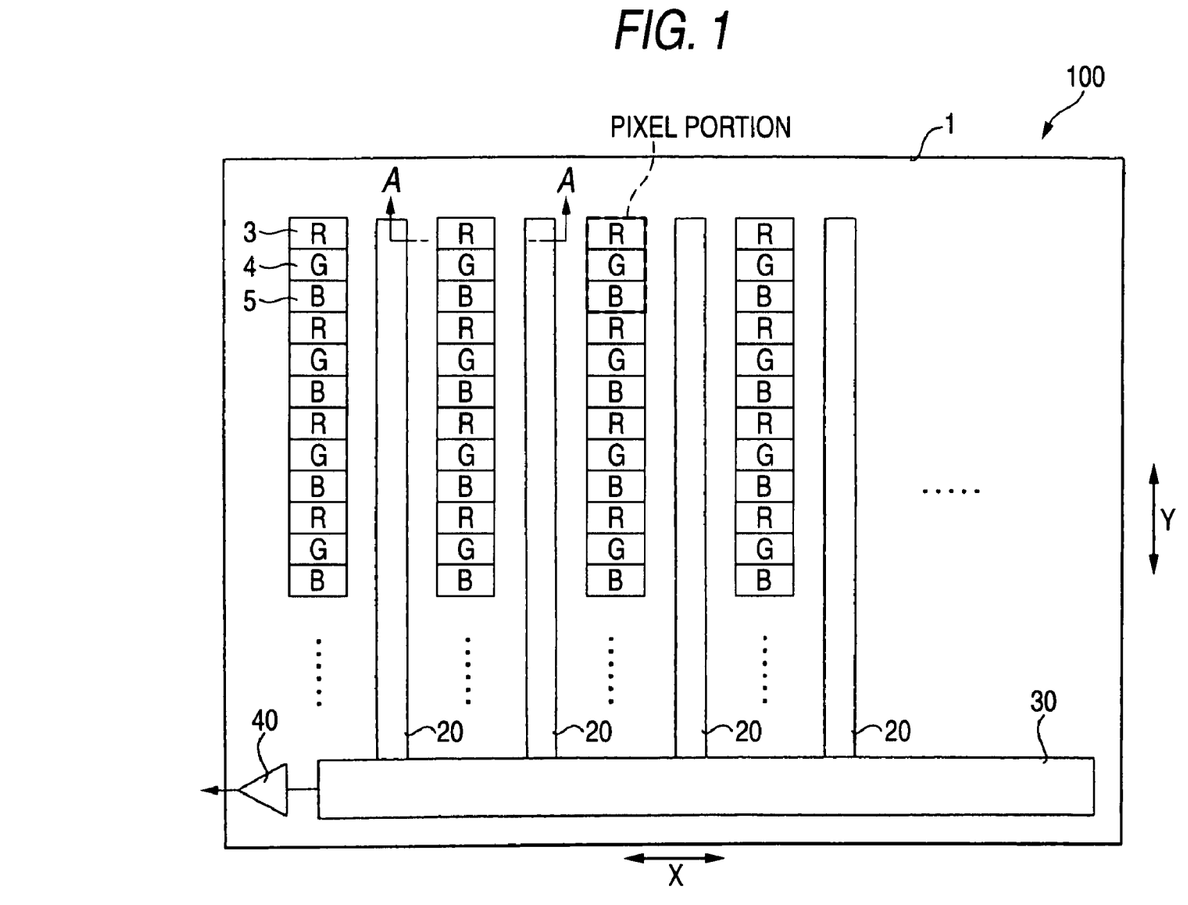
FIG. 1 is a typical plan view of a solid-state image sensing device for explaining a first embodiment of the invention.
Figure 2:
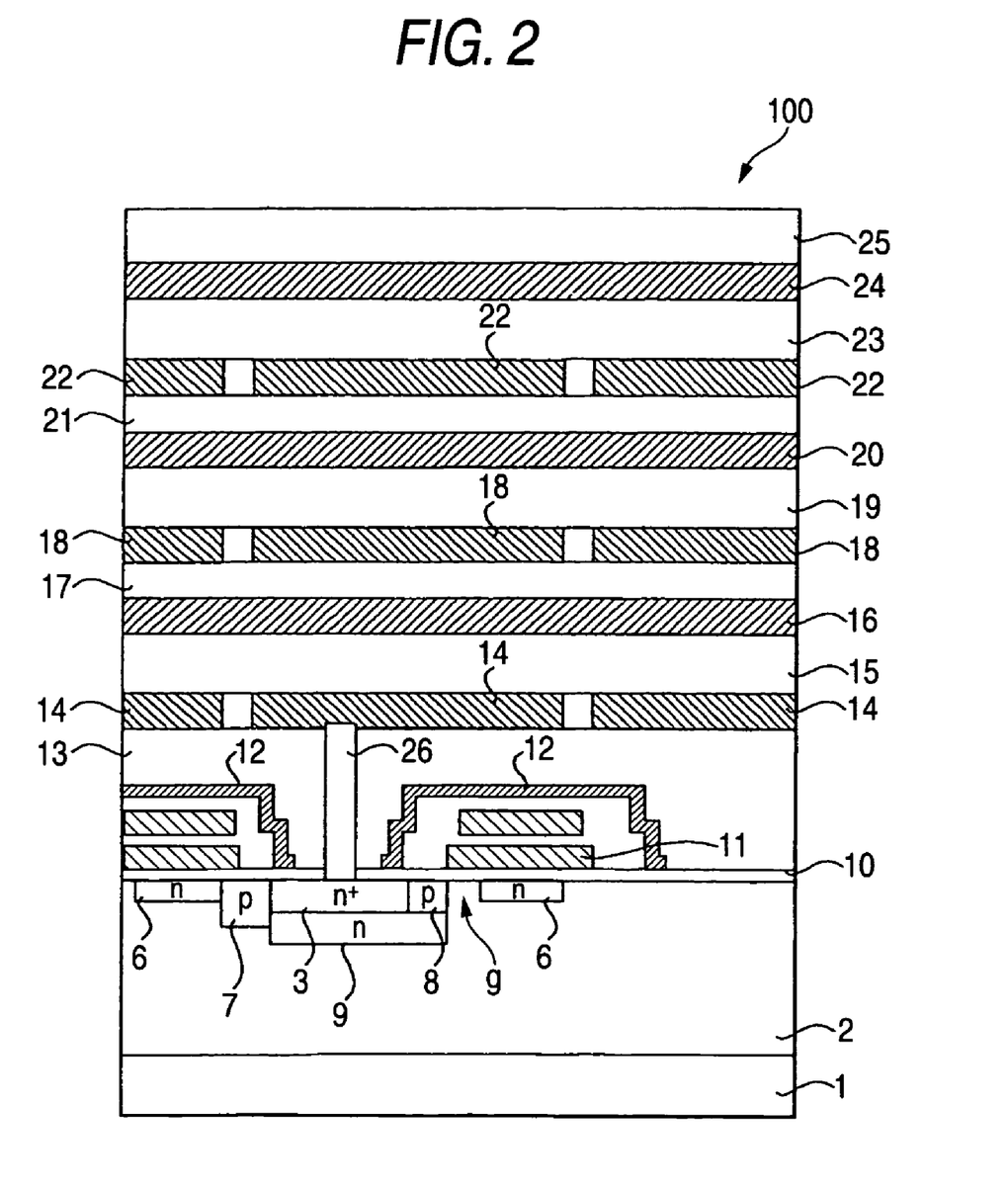
FIG. 2 is a typical sectional view taken along the line A-A, showing the solid-state image sensing device depicted in FIG. 1.

FIG. 1 is a typical plan view of a solid-state image sensing device for explaining a first embodiment of the invention. FIG. 2 is a typical sectional view taken along the line A-A, showing the solid-state image sensing device depicted in FIG. 1.

As shown in FIG. 2, an R photoelectric conversion film 15, a G photoelectric conversion film 19 and a B photoelectric conversion film 23 are stacked in this order above an n-type semiconductor substrate 1 of a first conduction type. The R photoelectric conversion film 15 detects red (R) light and generates red signal charge corresponding to the detected light. The G photoelectric conversion film 19 detects green (G) light and generates green signal charge corresponding to the detected light. The B photoelectric conversion film 23 detects blue (B) light and generates blue signal charge corresponding to the detected light. Incidentally, the order of stack of the respective photoelectric conversion films is not limited to this order. An organic material is preferably used as the material of each photoelectric conversion film. The number of the photoelectric conversion films need not be three. At least one photoelectric conversion layer can be stacked.

As shown in FIG. 1, n+ regions 3, n+ regions 4 and n+ regions 5 are formed in a surface portion of the n-type semiconductor substrate 1. Each of the n+ regions 3 is a high-density n-type impurity region in which signal charge generated in the R photoelectric conversion film 15 is accumulated. Each of the n+ regions 4 is a high-density n-type impurity region in which signal charge generated in the G photoelectric conversion film 19 is accumulated. Each of the n+ regions 5 is a high-density n-type impurity region in which signal charge generated in the B photoelectric conversion film 23 is accumulated. A combination of three n+ regions 3 to 5 arranged in a column direction (Y direction in FIG. 1) is used as a pixel portion. Such pixel portions are arranged in the form of a tetragonal lattice both in a line direction (X direction in FIG. 1) and in the column direction. Because a signal corresponding to R, G and B signal charges detected by the respective photoelectric conversion films located in the same position can be obtained from one pixel portion, one pixel data can be generated on the basis of this signal. Incidentally, the n+ regions 3 to 5 are equivalent to first impurity regions in the Scope of Claim.

Vertical transfer portions 20, a horizontal transfer portion 30 and an output portion 40 are formed in the surface of the n-type semiconductor substrate 1. The vertical transfer portions 20 read signal charges accumulated in the n+ regions 3 to 5 and transfer the signal charges in the column direction. The signal charges transferred from the vertical transfer portions 20 are further transferred in the line direction by the horizontal transfer portion 30. A signal corresponding to the signal charges transferred from the horizontal transfer portion 30 is outputted to the outside by the output portion 40. As described above, the solid-state image sensing device 100 is configured so that a signal is read by a CCD type signal reading portion which includes the vertical transfer portions 20, the horizontal transfer portion 30, and the output portion 40.

As shown in FIG. 2, the R photoelectric conversion film 15 is sandwiched between a pixel electrode film 14 and a counter electrode film 16. The G photoelectric conversion film 19 is sandwiched between a pixel electrode film 18 and a counter electrode film 20. The B photoelectric conversion film 23 is sandwiched between a pixel electrode film 22 and a counter electrode film 24.

A transparent electrically insulating film 17 is provided between the counter electrode film 16 and the pixel electrode film 18. A transparent electrically insulating film 21 is provided between the counter electrode film 20 and the pixel electrode film 22. A transparent electrically insulating film 25 is provided on the counter electrode film 24.

The pixel electrode films 14, 18 and 22 are partitioned in accordance with the pixel portions. Although the counter electrode films 16, 20 and 24 are not partitioned in accordance with the pixel portions because they can be used in common with all the pixel portions, the counter electrode films 16, 20 and 24 may be partitioned in accordance with the pixel portions. The photoelectric conversion films may be also partitioned in accordance with the pixel portions.

A p-well layer 2 is formed in the surface portion of the n-type semiconductor substrate 1. The p-well layer 2 is a p-type impurity region of a second conduction type reverse to the first conduction type. The n+ regions 3 are formed in a surface portion of the p-well layer 2. The partitions of the pixel electric film 14 are connected to the n+ regions 3 by vertical wires 26 respectively. As a result, the R photoelectric conversion film 15 is electrically connected to the n+ regions 3. The vertical wires 26 are electrically insulated from other portions than the pixel electrode film 14 and the n+ regions 3 connected to each other.

Incidentally, a sectional portion of one of the n+ regions 3 is shown in FIG. 2. Sectional portions of the n+ regions 4 and 5 can be shown in the same manner as in FIG. 2 except that the n+ region 3 shown in FIG. 2 is replaced by an n+ region 4 or 5 and the pixel electrode film 14 connected by the vertical wire 26 is replaced by the pixel electrode film 18 in the case of the n+ region 4 or by the pixel electrode film 22 in the case of the n+ region 5. Accordingly, the description of the sectional portions of the n+ regions 4 and 5 will be omitted.

Referring back to FIG. 2, an n region 6 which is an n-type impurity region extending in the Y direction and being lower in density than the n+ region 3 is formed in the right of the n+ region 3 so as to be slightly apart from the n+ region 3. An n region 9 (equivalent to a second impurity region in the Scope of Claim) which is an n-type impurity region lower in density than the n+ region 3 is formed under the n+ region 3. The n+ region 3 and the n region 9 are in contact with each other. The n region 9 is formed to be larger than the n+ region 3 so that a part of the n region 9 protrudes from the n+ region 3 toward the n region 6. Incidentally, the n region 9 need not be larger than the n+ region 3. For example, the n region 9 may be formed under the n+ region 3 so as to be located in a position nearer the n region 6 than the n+ region 3.

Signal charge generated in the R photoelectric conversion film 15 is poured and accumulated in the n+ region 3 through the pixel electrode film 14 and the vertical wire 26. The signal charge accumulated in the n+ region 3 and overflowing is poured into the n region 9 under the n+ region 3 and accumulated in the n region 9. Accordingly, signal charge generated in the R photoelectric conversion film 15 is accumulated in the n region 9 via the n+ region 3. Surplus electric charge accumulated in the n region 9 is drained to the n-type semiconductor substrate 1 by a known overflow drain structure.

A transfer electrode 11, which serves also as a read electrode and which is made of polysilicon, is formed above the n region 6 so as to reach a position above the n region 9. A shading film 12 is provided above the transfer electrode 11. The n region 6 and the transfer electrode 11 form a vertical transfer portion 20. When a high-potential read pulse is applied to the transfer electrode 11, a region q of the p-well layer 2 which is located between the n region 9 and the n region 6 so as to overlap with the transfer electrode 11 serves as a signal charge reading region for reading signal charge accumulated in the n region 9. The signal charge accumulated in the n region 9 is further accumulated in the n region 6 via the signal reading region.

A p region 8 (equivalent to a third impurity region in the Scope of Claim) which is a p-type impurity region higher in density than the p-well layer 2 is formed in the surface of the n-type semiconductor substrate 1 and between the n+ region 3 and the signal reading region. The p region 8 can be located in any position as long as the p region 8 is disposed in the surface of the n-type semiconductor substrate 1 and between the n+ region 3 and the signal charge reading region. For example, the p region 8 may be formed so that all of the portion between the n+ region 3 and the signal charge reading region is filled with the p region 8 as shown in FIG. 2 or part of the portion between the n+ region 3 and the signal charge reading region is filled with the p region 8.

A p region higher in density than the p-well layer 2 or a device separation region 7 made of silicon oxide or the like is provided in the surface portion in the left of the n+ region 3 to attain separation from an adjacent vertical transfer portion 20. A silicon oxide film 10 is formed as the outermost surface of the n-type semiconductor substrate 1. The transfer electrode 11 is formed on the silicon oxide film 10.

The shading film 12 and the transfer electrode 11 are embedded in the transparent electrically insulating layer 13.

Figure 3:
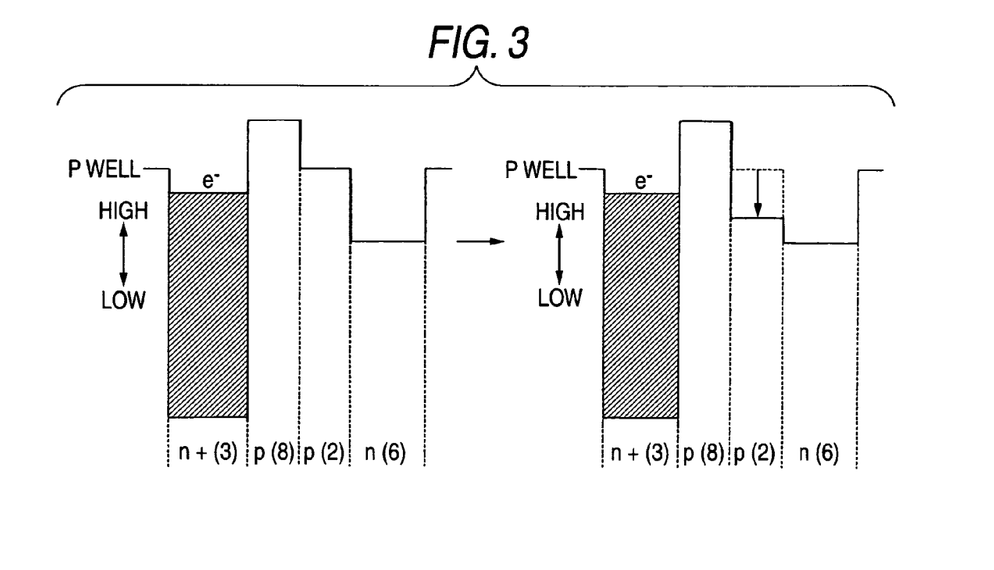
FIG. 3 is a view showing a potential transition state of each constituent member in the partial section of the solid-state image sensing device depicted in FIG. 2.

FIG. 3 is a view showing a potential transition state of the n+ region 3, the p region 8, the p-well layer 2 and the n region 6 arranged side by side in a direction parallel to the substrate in the partial section of the solid-state image sensing device shown in FIG. 2. A left part of FIG. 3 shows a state in which a read pulse is not applied to the transfer electrode 11. A right part of FIG. 3 shows a state in which a read pulse is applied to the transfer electrode 11.

As shown in FIG. 3, when a read pulse is applied to the transfer electrode 11, the potential of the p-well layer 2 between the p region 8 and the n region 6 is lowered to form a signal charge reading region. Signal charge accumulated in the n+ region 3, however, does not flow into the n region 6 because the p region 8 serves as a potential barrier.

Figure 4:
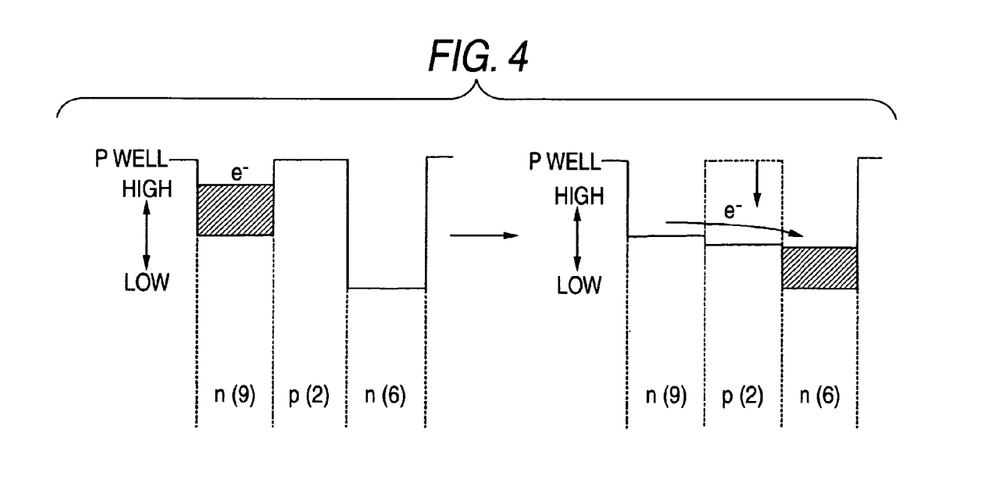
FIG. 4 is a view showing a potential transition state of each constituent member in the partial section of the solid-state image sensing device depicted in FIG. 2.

FIG. 4 is a view showing a potential transition state of the n region 9, the p-well layer 2 and the n region 6 arranged side by side in a direction parallel to the substrate in the partial section of the solid-state image sensing device shown in FIG. 2. A left part of FIG. 4 shows a state in which a read pulse is not applied to the transfer electrode 11. A right part of FIG. 4 shows a state in which a read pulse is applied to the transfer electrode 11.

As shown in FIG. 4, when a read pulse is applied to the transfer electrode 11, the potential of the p-well layer 2 between the n region 9 and the n region 6 is lowered to form a signal charge reading region. Signal charge accumulated in the n region 9 is read through the signal charge reading region and accumulated in the n region 6. The signal charge accumulated in the n region 6 is transferred in the column direction on the basis of the transfer pulse applied to the transfer electrode 11. After the signal charge is then transferred in the line direction by the horizontal transfer portion 30, the signal charge is outputted as a red signal from the output portion.

Figure 5:
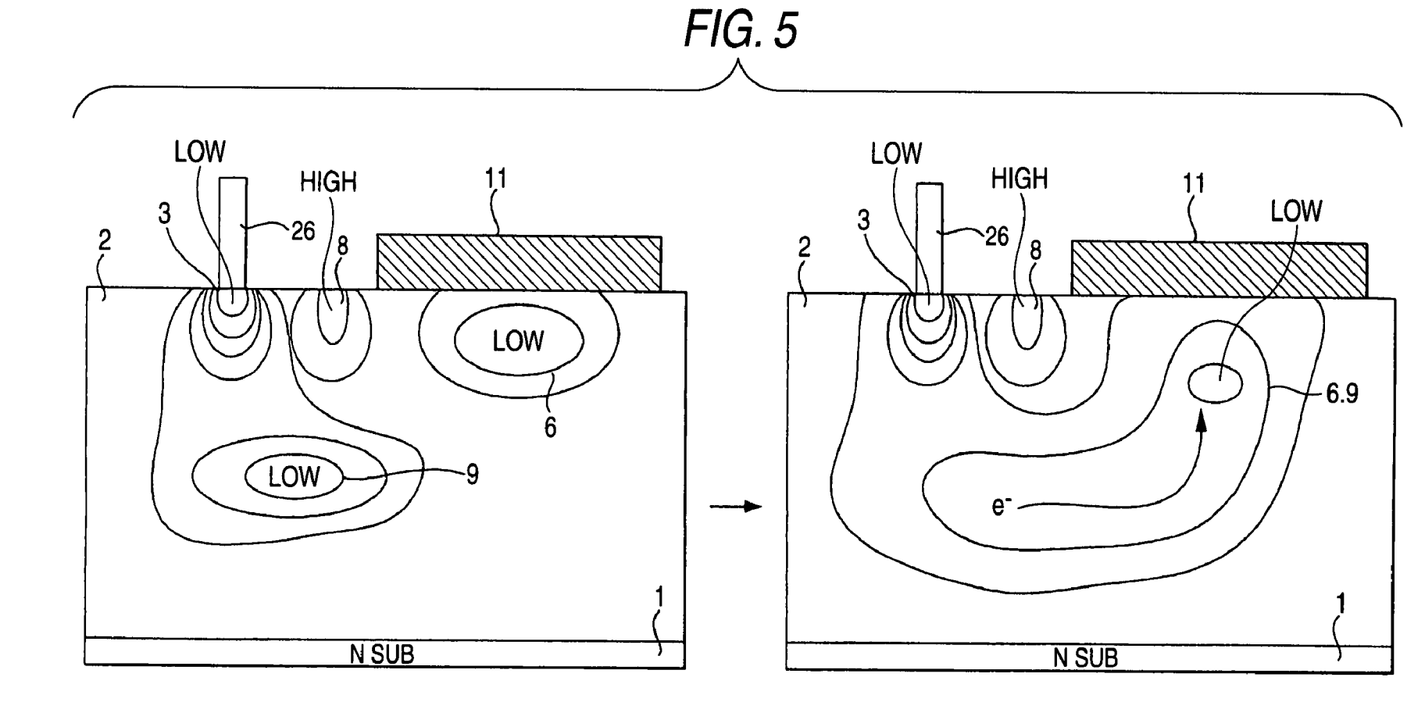
FIG. 5 is a view typically showing a potential transition state in the partial section of the solid-state image sensing device depicted in FIG. 2.

FIG. 5 is a view typically showing a potential transition state in the partial section of the solid-state image sensing device shown in FIG. 2. A left part of FIG. 5 shows a state in which a read pulse is not applied to the transfer electrode 11. A right part of FIG. 5 shows a state in which a read pulse is applied to the transfer electrode 11. In FIG. 5, a symbol corresponding to each constituent member in FIG. 2 designates potential of the constituent member.

As shown in FIG. 5, when a read pulse is applied to the transfer electrode 11, signal charge accumulated in the n region 9 flows into the n region 6 through the inside of the n-type semiconductor substrate 1. On the other hand, signal charge accumulated in the n+ region 3 does not flow into the n region 6 through the surface of the n-type semiconductor substrate 1 between the n+ region 3 and the n region 6 because the potential of the p region 8 is unchanged.

In the solid-state image sensing device 100, dark current is gathered because part of signal charge accumulated in the n region 9 flows into the n region 6 through the surface of the n-type semiconductor substrate 1 between the p region 8 and the n region 6. The amount of the dark current is however greatly lower compared with the background art (right part in FIG. 12) in which large part of signal charge is transferred through the surface of the n-type semiconductor substrate 1. In this manner, high-quality image sensing free from the influence of the dark current can be made by the solid-state image sensing device 100.

Although this embodiment has described on the case where the p region 8 is formed in the surface of the n-type semiconductor substrate 1 between the n+ region 3 and the signal charge reading region, the p region 8 may be dispensed with as long as another region can serve as a potential barrier for preventing signal charge accumulated in the n+ region 3 from flowing into other portions than the n region 9. For example, the p-well layer 2 may be formed to serve as the potential barrier without provision of the p region 8. When the p region 8 high in density is used as the potential barrier, the effect of preventing signal charge accumulated in the n+ region 3 from flowing into other portions than the n region 9 can be improved.

In this embodiment, the n region 9 is preferably formed so that part of the n region 9 digs into the signal charge reading region. In this case, for example, the n region 9 may be formed so that the n region 6-side end portion of the n region 9 extends to a portion below the transfer electrode 11. According to this configuration, signal charge can be read easily from the n region 9.

Figure 6:
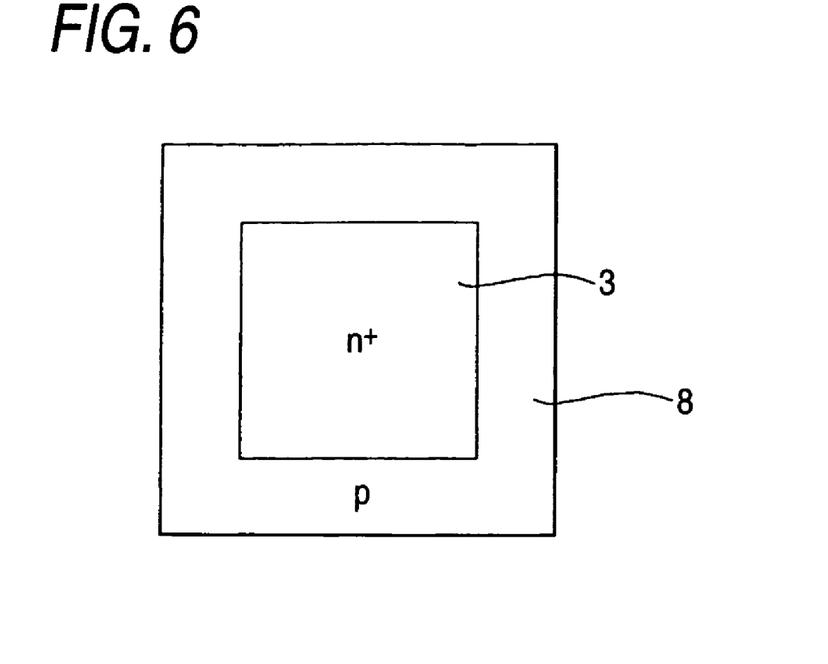
FIG. 6 is a partly enlarged view of a preferred configuration of the solid-state image sensing device depicted in FIG. 1, from a direction of incidence of light.

In this embodiment, the p region 8 is preferably formed in the surface of the n-type semiconductor substrate 1 so as to surround the n+ region 3. FIG. 6 is a partly enlarged view of the solid-state image sensing device 100 from the direction of incidence of light. As shown in FIG. 6, when the p region 8 is formed to surround the n+ region 3, the effect of preventing signal charge accumulated in the n+ region 3 from flowing into other portions than the n region 9 can be improved more greatly.

In this embodiment, the n+ region 3 is depleted in the boundary portion between the n+ region 3 and the p-well layer 2 or the p region 7 or 8 in the periphery of the n+ region 3, so that dark current generated in the surface of the n-type semiconductor substrate 1 flows into the depleted region. Therefore, it is preferable that the size (surface area in view from the direction of incidence of light) of the n+ region 3 is set to be as small as possible. This is because reduction in size permits reduction in the size of the boundary portion and reduction in the amount of the dark current flowing into the n+ region 3.

Figure 7:
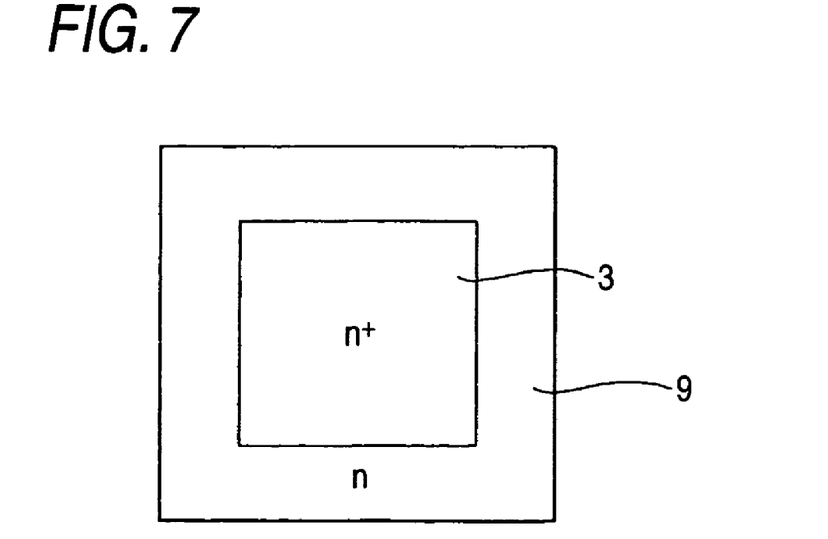
FIG. 7 is a partly enlarged view of a preferred configuration of the solid-state image sensing device depicted in FIG. 1, from a direction of incidence of light.

Although it is preferable that the size of the n+ region 3 is set to be as small as possible, the degree of reduction in size is limited. For example, the size of the n+ region 3 needs to be not smaller than the surface area of the vertical wire 26 so that the n+ region 3 can be connected to the vertical wire 26. It is ideal that the surface area of the n+ region 3 is equal to the surface area of the vertical wire 26. If the surface area of the n+ region 3 is larger than the surface area of the n region 9, the depleted portion of the n+ region 3 increases. It is therefore preferable that the surface area of the n+ region 3 is set to be smaller than the surface area of the n region 9. In the meaning to reduce the depleted portion of the n+ region 3, it is preferable that the n+ region 3 and the n region 9 are positioned so that the n+ region 3 can be entirely settled in the surface area of the n region 9 in view from the direction of incidence of light (see FIG. 7) while the surface area of the n region 9 is set to be larger than the surface area of the n+ region 3.

In this embodiment, it is preferable that the vertical wire 26 is connected to the n+ region 3 in an intermediate position between n regions 6 adjacent to each other in the line direction. According to this configuration, the dark current flowing into the n+ region 3 can be reduced to the minimum.

Second Embodiment

Figure 8:
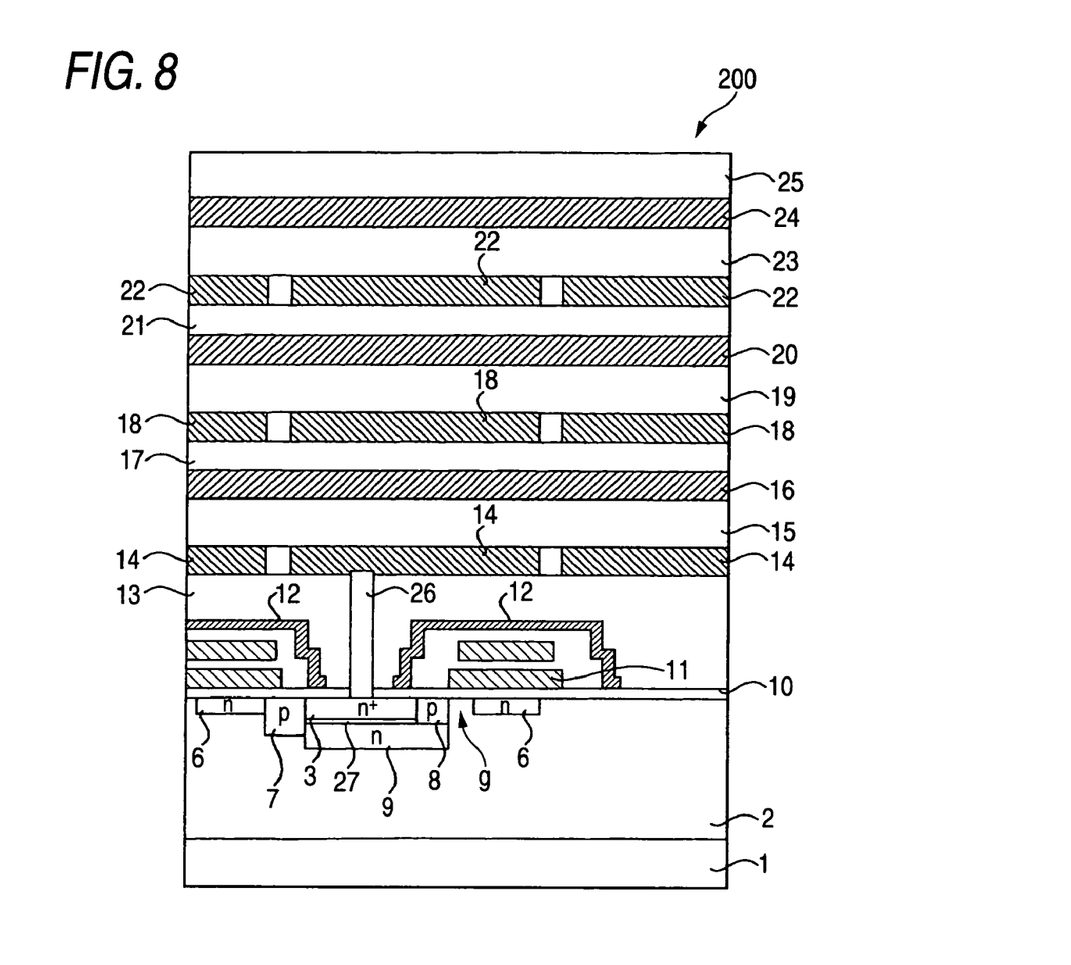
FIG. 8 is a partly sectional typical view of a solid-state image sensing device for explaining a second embodiment of the invention.

FIG. 8 is a partly sectional typical view of a solid-state image sensing device for explaining a second embodiment of the invention. In FIG. 8, the same constituent parts as those in FIG. 2 are referred to by the same numerals.

The solid-state image sensing device 200 shown in FIG. 8 is configured so that a p region 27 (fourth impurity region) which is a p-type impurity region lower in density than the p-well layer 2 is provided between the n+ region 3 and the n region 9 in addition to the solid-state image sensing device 100 shown in FIG. 2. The p region 27 needs to have a surface area at least equal to the surface area of the n+ region 3.

Figure 9:
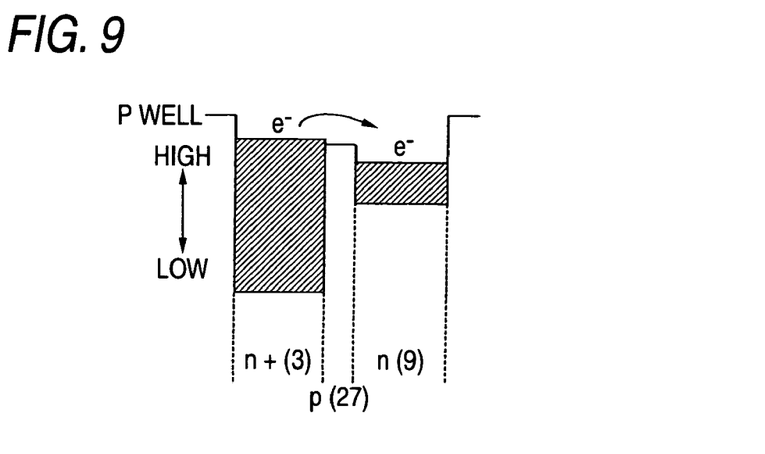
FIG. 9 is a view showing potential of each constituent member in the partial section of the solid-state image sensing device depicted in FIG. 8.

FIG. 9 is a view showing potential of the n+ region 3, the p region 27 and the n region 9 arranged in a depthwise direction perpendicular to the substrate in the partial section of the solid-state image sensing device shown in FIG. 8. As shown in FIG. 9, signal charge accumulated in the n+ region 3 and overflowing is poured into the n region 9 over the p region 27.

In the first embodiment in which there is no p region 27 provided between the n+ region 3 and the n region 9, signal charge cannot be perfectly transferred from the n region 9 to the n region 6 because the n region 9 is not perfectly depleted. On the other hand, in this embodiment in which the p region 27 is provided between the n+ region 3 and the n region 9, signal charge can be perfectly transferred from the n region 9 to the n region 6 because the n region 9 can be perfectly depleted.

Third Embodiment

Although the first and second embodiments have been described on the case where a CCD type signal reading portion is used as the signal reading portion of the solid-state image sensing device, the same effect as in the first and second embodiments can be obtained also in the case where an MOS type signal reading portion is used as the signal reading portion of the solid-state image sensing device.

Figure 10:
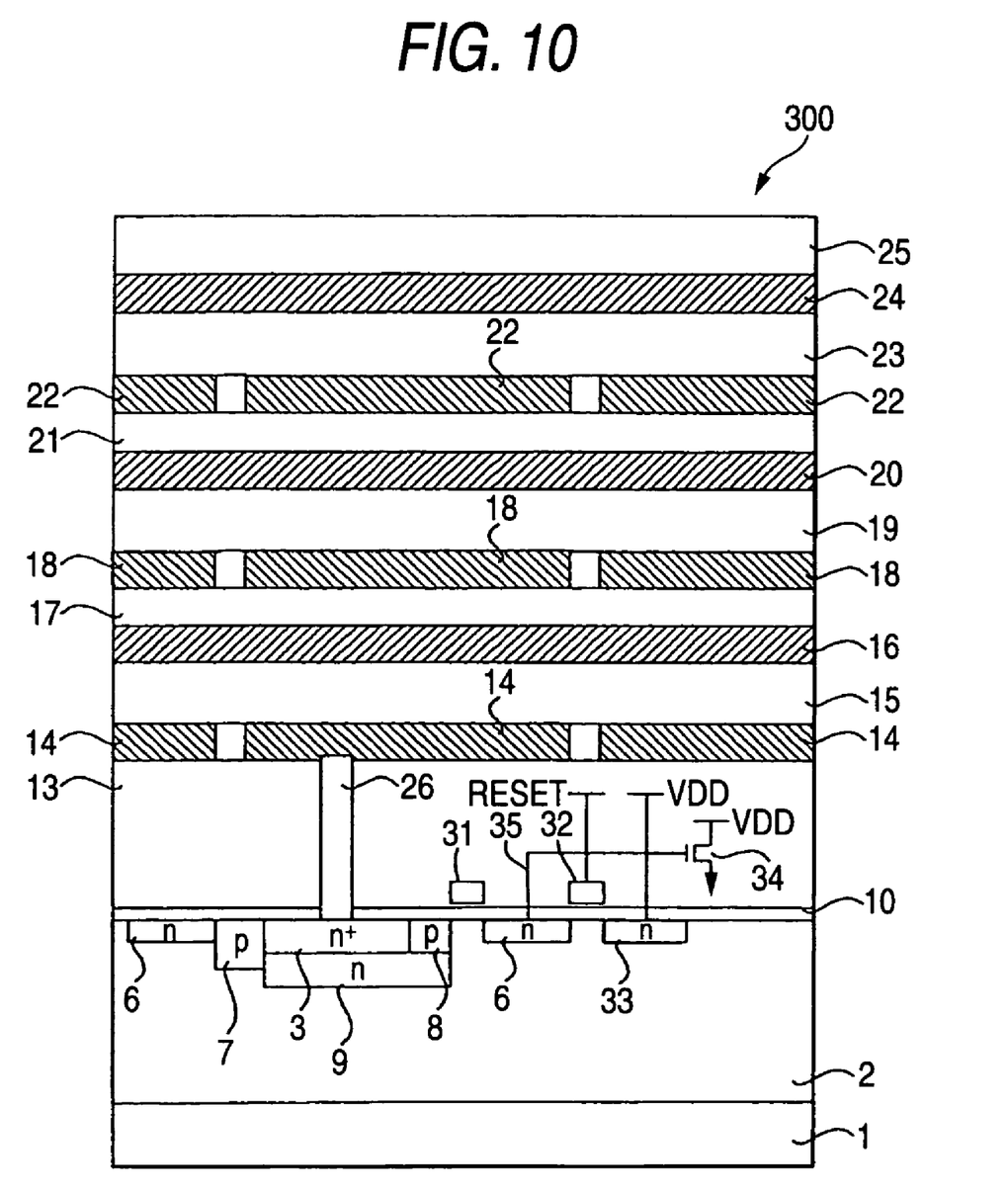
FIG. 10 is a partly sectional typical view of a solid-state image sensing device for explaining a third embodiment of the invention.

FIG. 10 is a partly sectional typical view of a solid-state image sensing device for explaining a third embodiment of the invention. In FIG. 10, the same constituent parts as those in FIG. 2 are referred to by the same numerals.

As shown in FIG. 10, the signal reading portion of the solid-state image sensing device 300 includes gate electrodes 31 and 32, an n region 6, an n region 33, and an amplification transistor 34.

The gate electrode 31 is equivalent to the transfer electrode 11 of the solid-state image sensing device 100. The gate electrode 31 is formed above the p-well layer 2 and between the p region 8 and the n region 6. When a high potential is applied to the gate electrode 31, a signal charge reading region is formed in a region of the p-well layer 2 overlapping with the gate electrode 31. Signal charge accumulated in the n region 9 is further accumulated in the n region 6 via the signal charge reading region. A wire 35 of a metal such as aluminum is connected to the n region 6. The metal wire 35 is connected to a gate electrode of the amplification transistor 34. Accordingly, a gate voltage applied to the gate electrode of the amplification transistor 34 is modulated in accordance with the amount of signal charge accumulated in the n region 6. In this manner, a signal corresponding to the signal charge (substantially equivalent to the signal charge generated in the R photoelectric conversion film 15) accumulated in the n region 6 can be read to the outside of the solid-state image sensing device 300.

Incidentally, the signal charge accumulated in the n region 6 is drained to a reset drain (not shown) through the gate electrode 32. The structure of the amplification transistor and the structure of the reset transistor in the solid-state image sensing device 300 are the same as those in the background-art MOS type solid-state image sensing device.

As described above, also in the case where an MOS type signal reading portion is used as the signal reading portion of the solid-state image sensing device 100, signal charge generated in the R photoelectric conversion film 15 is once accumulated in the n region 9 inside the n-type semiconductor substrate 1 and then accumulated in the n region 6 through the signal charge reading region in the same manner as in the first embodiment. For this reason, the influence of the dark current generated in the surface of the n-type semiconductor substrate 1 can be reduced extremely, so that high-quality image sensing can be made.

Incidentally, an MOS type signal reading portion can be used as the signal reading portion of the solid-state image sensing device 200. The same effect as in the second embodiment can be obtained also in this case.

Although the first, second and third embodiments have been described on the case where carriers generated in each photoelectric conversion film are electrons, the first and second conduction types described in the first, second and third embodiments are reversed in the case where the carriers are holes. That is, when the carriers are electrons, the first conduction type is an n type and the second conduction type is a p type. When the carriers are holes, the first conduction type is a p type and the second conduction type is an n type.

This application is based on Japanese Patent application JP 2005-66038, filed Mar. 9, 2005, the entire content of which is hereby incorporated by reference, the same as if set forth at length.

What is claimed is:

1. A solid-state image sensing device provided with photoelectric conversion films stacked above a semiconductor substrate, comprising:
   first impurity regions of a first conduction type electrically connected to the photoelectric conversion films and provided in a surface of the semiconductor substrate for accumulating signal charges generated in the photoelectric conversion films;
   second impurity regions of the first conduction type provided under the first impurity regions and lower in density than the first impurity regions for accumulating the signal charges accumulated in the first impurity regions;
   signal charge reading regions for reading the signal charges accumulated in the second impurity regions; and
   third impurity regions of a second conduction type provided in the surface of the semiconductor substrate and between the first impurity regions and the signal charge reading regions and reverse to the first conduction type.

2. The solid-state image sensing device according to claim 1, further comprising fourth impurity regions of the second conduction type provided between the first impurity regions and the second impurity regions.

3. The solid-state image sensing device according to claim 2, wherein part of the second impurity regions dig into the signal charge reading regions.

4. The solid-state image sensing device according to claim 3, wherein the third impurity regions are provided to surround the first impurity regions respectively.

5. The solid-state image sensing device according to claim 2, wherein the third impurity regions are provided to surround the first impurity regions respectively.

6. The device of claim 2, wherein the third impurity regions are directly adjacent to each of the first, second and fourth impurity regions.

7. The device of claim 2, wherein an electrical potential of the fourth impurity regions is fixed.

8. The device of claim 7, wherein the fourth impurity regions are lower in density than a p-well layer.

9. The solid-state image sensing device according to claim 1, wherein part of the second impurity regions dig into the signal charge reading regions.

10. The solid-state image sensing device according to claim 9, wherein the third impurity regions are provided to surround the first impurity regions respectively.

11. The solid-state image sensing device according to claim 1, wherein the third impurity regions are provided to surround the first impurity regions respectively.

12. The device of claim 1, wherein the third impurity regions are directly adjacent to each of the first and second impurity regions.

13. The device of claim 1, wherein the second impurity regions are provided completely inside the semiconductor substrate below the surface of the substrate.

14. A method for reading a signal charge from a solid-state image sensing device, the solid-state image sensing device being provided with photoelectric conversion films stacked above a semiconductor substrate, and comprising,
   first impurity regions of a first conduction type electrically connected to the photoelectric conversion films and provided in a surface of the semiconductor substrate for accumulating signal charges generated in the photoelectric conversion films;
   second impurity regions of the first conduction type provided under the first impurity regions and completely inside the semiconductor substrate and lower in density than the first impurity regions for accumulating the signal charges accumulated in the first impurity regions;

signal charge reading regions for reading the signal charges accumulated in the second impurity regions; and third impurity regions of a second conduction type provided in the surface of the semiconductor substrate and between the first impurity regions and the signal charge reading regions and reverse to the first conduction type, in which the third impurity regions are in contact with other impurity regions, wherein the method comprises reading out the signal charges generated by photoelectric conversion and accumulated in the first impurity regions via the second impurity regions and an inside of the semiconductor substrate.

15. The method according to claim 14, wherein fourth impurity regions of the second conduction type are provided between the first impurity regions and the second impurity regions, and signal charges accumulated in the first impurity regions and overflowing are once accumulated in the second impurity regions and the signal charges accumulated in the second impurity regions are read out to a transfer portion.

16. The method according to claim 15, wherein when the signal charges are read out, the second impurity regions are depleted.

17. The method according to claim 14, wherein a part of the second impurity regions is provided inside the signal charge reading regions.

* * * * *